(12) United States Patent
Twitchen et al.

(10) Patent No.: US 9,169,989 B2
(45) Date of Patent: Oct. 27, 2015

(54) DIAMOND OPTICAL ELEMENT

(75) Inventors: Daniel James Twitchen, Berkshire (GB); Joseph Michael Dodson, Berkshire (GB); Matthew Lee Markham, Berkshire (GB); Fedor Jelezko, Stuttgart (DE)

(73) Assignee: Element Six Limited, Didcot (GB)

( * ) Notice: Subject to any disclaimer, the term of this patent is extended or adjusted under 35 U.S.C. 154(b) by 56 days.

(21) Appl. No.: 13/811,262

(22) PCT Filed: Aug. 2, 2011

(86) PCT No.: PCT/EP2011/063278
§ 371 (c)(1),
(2), (4) Date: Jun. 10, 2013

(87) PCT Pub. No.: WO2012/016977
PCT Pub. Date: Feb. 9, 2012

(65) Prior Publication Data
US 2013/0270991 A1 Oct. 17, 2013

(30) Foreign Application Priority Data

Aug. 4, 2010 (GB) .................... 1013112.6

(51) Int. Cl.
*H01J 5/16* (2006.01)
*H01J 61/40* (2006.01)
(Continued)

(52) U.S. Cl.
CPC . *F21V 5/00* (2013.01); *B82Y 20/00* (2013.01); *C30B 25/02* (2013.01); *C30B 29/04* (2013.01);
(Continued)

(58) Field of Classification Search
CPC ........ B82Y 20/00; C30B 25/02; C30B 29/04; F21V 5/00; G02B 1/02; H01L 33/58

USPC ......... 313/110; 428/688, 141, 172, 174, 332; 362/317, 335, 326; 257/98; 33/559
See application file for complete search history.

(56) References Cited

U.S. PATENT DOCUMENTS

| | | | |
|---|---|---|---|
| 5,245,189 A * | 9/1993 | Satoh et al. ................ | 250/343 |
| 2005/0063046 A1* | 3/2005 | Arata et al. ................ | 359/368 |

(Continued)

FOREIGN PATENT DOCUMENTS

| | | |
|---|---|---|
| EP | 1290251 B1 | 11/2005 |
| EP | 1292726 B1 | 9/2008 |

(Continued)

OTHER PUBLICATIONS

Hutchings, I.M., "Tribology: Friction and Wear of Engineering Materials", pp. 8-9, 1992.
(Continued)

*Primary Examiner* — Anh Mai
*Assistant Examiner* — Glenn Zimmerman
(74) *Attorney, Agent, or Firm* — Armstrong Teasdale LLP

(57) ABSTRACT

A method of manufacturing an optical element, the method comprising: growing a first layer of single crystal diamond material via a chemical vapor deposition technique using a gas phase having a first nitrogen concentration; growing a second layer of single crystal diamond material over said first layer via a chemical vapor deposition technique using a gas phase having a second nitrogen concentration, wherein the second nitrogen concentration is lower than the first nitrogen concentration; forming an optical element from at least a portion of the second layer of single crystal diamond material; and forming an out-coupling structure at a surface of the optical element for increasing out-coupling of light.

18 Claims, 4 Drawing Sheets

(51) Int. Cl.

| | |
|---|---|
| *H01K 1/26* | (2006.01) |
| *H01K 1/30* | (2006.01) |
| *F21V 5/00* | (2015.01) |
| *B82Y 20/00* | (2011.01) |
| *C30B 25/02* | (2006.01) |
| *C30B 29/04* | (2006.01) |
| *G02B 1/02* | (2006.01) |
| *H01L 33/58* | (2010.01) |

(52) U.S. Cl.
CPC . *G02B 1/02* (2013.01); *H01L 33/58* (2013.01); *Y10T 428/24355* (2015.01); *Y10T 428/24612* (2015.01); *Y10T 428/24628* (2015.01); *Y10T 428/26* (2015.01)

(56) References Cited

U.S. PATENT DOCUMENTS

| | | | |
|---|---|---|---|
| 2006/0157713 | A1 | 7/2006 | Linares et al. |
| 2006/0234419 | A1 | 10/2006 | Linares et al. |
| 2008/0118966 | A1* | 5/2008 | Chang et al. ............... 435/173.1 |
| 2009/0127506 | A1* | 5/2009 | Twitchen et al. ......... 252/182.34 |
| 2009/0297739 | A1* | 12/2009 | Baily et al. ................. 428/32.74 |
| 2009/0311478 | A1* | 12/2009 | Linares ......................... 438/478 |
| 2009/0311852 | A1* | 12/2009 | Linares ......................... 438/478 |
| 2011/0163291 | A1* | 7/2011 | Scarsbrook et al. .............. 257/9 |
| 2011/0199005 | A1* | 8/2011 | Bretschneider et al. ...... 315/152 |
| 2012/0051996 | A1* | 3/2012 | Scarsbrook et al. .......... 423/446 |

FOREIGN PATENT DOCUMENTS

| | | |
|---|---|---|
| GB | 2433737 A | 7/2007 |
| JP | 2008-179505 A | 8/2008 |
| JP | 2010-023066 A | 2/2010 |
| WO | 01/96633 A1 | 12/2001 |
| WO | 01/96634 A1 | 12/2001 |
| WO | 03/014427 A1 | 2/2003 |
| WO | 2004/046427 A1 | 6/2004 |
| WO | 2006/136929 A2 | 12/2006 |
| WO | 2007/007126 A1 | 1/2007 |
| WO | 2007/009037 A1 | 1/2007 |
| WO | 2010/010344 A1 | 1/2010 |
| WO | 2010/010352 A1 | 1/2010 |
| WO | WO 2010010344 A1 * | 1/2010 |

OTHER PUBLICATIONS

Nelder, J.A., et al., "A Simplex Method for Function Minimization", Oxford Journal, 7, 308, 1965.

Howarth, D.F., et al., "Generalization of the Lineshape Useful in Magnetic Resonance Spectroscopy", J. Magnetic Resonance, 161, 215-221, 2003.

Hyde, J.S., et al., "Pseudo Field Modulation in EPR Spectroscopy", Applied Magnetic Resonance, I, 483-496, 1990.

Lawson, S.D., et al., "On the Existence of Positively Charged Single-Substitutional Nitrogen in Diamond", J. Phys. Condens. Matter, 10, 6171-6181, 1998 and 44.

International Search Report for PCT/EP2011/063278 dated Nov. 8, 2011.

Search Report for GB 1013112.6 dated Nov. 30, 2010.

Search Report for GB 1113244.6 dated Dec. 2, 2011.

* cited by examiner

DIAMOND OPTICAL ELEMENT

FIELD OF INVENTION

The present invention relates to diamond optical elements and methods of making the same. The present invention also relates to optical elements comprising a high quality single crystal diamond host material for single photon sources for applications such as magnetometry and quantum information processing.

BACKGROUND OF INVENTION

Over the last 20 years there has been substantial interest in the use and manipulation of single photon sources for quantum information processing.

Over the last decade, optically-active defects in diamond have been demonstrated as efficient and robust solid-state single photons sources owing to long decoherence times and strong optical dipole coupling at room temperature. Many optically active defects have been studied in diamond including silicon-vacancy (SiV), nickel and chromium-related defects, and the negatively charged nitrogen-vacancy (NV$^-$) defect. The NV$^-$ defect in particular has attracted a lot of interest because its spin state can be coherently manipulated with high fidelity owing to an extremely long coherence time (which may be quantified and compared using the transverse relaxation time T2), because of its specific electronic structure, and because of the availability of optical pumping. Moreover, the electron spin states of NV$^-$ defects can be read out through photons, which is a key ingredient towards using the NV$^-$ defects as qubits for long-distance quantum communications and scalable quantum computation. Such results make the NV$^-$ defect a competitive candidate for solid-state quantum information processing (QIP).

One major problem in producing materials suitable for quantum applications is preventing the qubits from decohering, or at least lengthening the time a system takes to decohere (i.e. lengthening the "decoherence time"). A long T2 time is desirable in applications such as quantum computing as it allows more time for the operation of an array of quantum gates and thus allows more complex quantum computations to be performed.

WO 2010010344 discloses that single crystal diamond material which has a high chemical purity, i.e. a low nitrogen content, and wherein a surface of the diamond material has been processed to minimise the presence of crystal defects, can be used to form a solid state system comprising a quantum spin defect. Where such materials are used as a host for quantum spin defects, long T2 times are obtained at room temperature and the frequency of the optical transitions used to read/write to devices are stable.

WO 2010010352 discloses that by carefully controlling the conditions under which diamond material is prepared using chemical vapour deposition (CVD) methods, it is possible to provide diamond material which combines a very high chemical purity with a very high isotopic purity. By controlling both the chemical purity and the isotopic purity of the materials used in the CVD process, it is possible to obtain synthetic diamond material which is particularly suitable for use as a host for a quantum spin defect. Where such materials are used as a host for quantum spin defects, long T2 times are obtained at room temperature and the frequency of the optical transitions used to read/write to the devices are stable. A layer of synthetic diamond material is disclosed which has a low nitrogen concentration and a low concentration of $^{13}C$. The layer of synthetic diamond material has very low impurity levels and very low associated point defect levels. In addition, the layer of synthetic diamond material has a low dislocation density, low strain, and vacancy and self-interstitial concentrations which are sufficiently close to thermodynamic values associated with the growth temperature that its optical absorption is essentially that of a perfect diamond lattice.

In light of the above, it is evident that WO 2010010344 and WO 2010010352 disclose methods of manufacturing high quality "quantum grade" single crystal diamond material. The term "quantum grade" diamond is used herein for diamond material which is suitable for use in applications that utilize the material's quantum spin properties. Specifically, the quantum grade diamond material's high purity makes it possible to isolate single defect centres using optical techniques known to the person skilled in the art.

One problem is that the single photon emission from defects in such materials can be very weak. For example, NV$^-$ defects in diamond exhibit a broad spectral emission associated with a Debye-Waller factor of the order of 0.05, even at low temperature. Emission of single photons in the Zero-Phonon Line (ZPL) is then extremely weak, typically of the order of a few thousands of photons per second. Such counting rates might be insufficient for the realization of advanced QIP protocols based on coupling between spin states and optical transitions within reasonable data acquisition times. This problem is also evident for other photon emitting defects within diamond.

In addition to the problem of weak emission, it is evident that the high refractive index of diamond means that due to total internal reflection very few photons can be collected within a small solid angle. Accordingly, there is a need to increase the light collection from single photon emitters in diamond for applications that include magnetometry and quantum information processing. In this regard, both WO 2010010344 and WO 2010010352 disclose that the quantum grade diamond material discussed therein may have a surface which has a macroscopic curvature, e.g. a lens with a radius of curvature of between about 10 μm and about 100 μm to collect and focus the light output from a quantum defect centre. It is suggested that an isotropic etch may be used to form macroscopic curved features, such as a lens, whilst controlling or reducing the surface roughness.

However, single crystal quantum grade diamond material can be difficult, time consuming, and expensive to manufacture, particular for large single crystals, when compared with lower grades of diamond. As such, it is difficult, time consuming, and costly to form a single crystal quantum grade diamond of sufficient size to incorporate an optical out-coupling structure such as a lens therein.

It is an aim of certain embodiments of the present invention to solve the aforementioned problem.

SUMMARY OF INVENTION

The aforementioned problem has been solved in accordance with a first aspect of the present invention by providing a method of manufacturing an optical element, the method comprising:
  growing a first layer of single crystal diamond material via a chemical vapour deposition technique using a gas phase having a first nitrogen concentration;
  growing a second layer of single crystal diamond material over said first layer via a chemical vapour deposition technique using a gas phase having a second nitrogen concentration, wherein the second nitrogen concentration is lower than the first nitrogen concentration;

forming an optical element from at least a portion of the second layer of single crystal diamond material; and forming an out-coupling structure at a surface of the optical element for increasing out-coupling of light, wherein the first layer of single crystal diamond material is grown using a gas phase having a nitrogen concentration of greater than or equal to 300 parts per billion (ppb) and less than or equal to 5 parts per million (ppm), calculated as molecular nitrogen, and wherein the second layer is grown using a gas phase having a nitrogen concentration of greater than or equal to 0.001 ppb and less than or equal to 250 ppb, calculated as molecular nitrogen.

The second layer may also be grown using a gas phase having a carbon source gas comprising $^{12}C$ in an amount of at least 99% of the total C content of the carbon source gas.

According to a second aspect of the present invention there is provided an optical element comprising:

a first portion of single crystal diamond material having first single substitutional nitrogen concentration;

a second portion of single crystal diamond material coupled to the first portion, the second portion having a second single substitutional nitrogen concentration which is lower than the first single substitutional nitrogen concentration; and an out-coupling structure formed at a surface of the optical element for increasing out-coupling of light, wherein the first portion is formed of a single crystal diamond material having one or more of: a single substitutional nitrogen concentration equal to or greater than 30 ppb, 50 ppb, 100 ppb, 200 ppb, 300 ppb, 500 ppb, 700 ppb, or 800 ppb; and an $NV^-$ concentration equal to or greater than 0.3 ppb, 0.5 ppb, 1 ppb, 2 ppb, 3 ppb, 5 ppb, 7 ppb, or 8 ppb, wherein the first portion of single crystal diamond material has one or more of: a single substitutional nitrogen concentration equal to or less than 5 ppm, 2 ppm, or 1 ppm; and an $NV^-$ concentration equal to or equal to or less than 50 ppb, 20 ppb, or 10 ppb, and wherein the second portion of single crystal diamond material is formed of a single crystal diamond material having one or more of: a single substitutional nitrogen concentration equal to or less than 20 ppb, 10 ppb, 5 ppb, 1 ppb or 0.5 ppb; an $NV^-$ concentration equal to or less than 0.15 ppb, 0.1 ppb, 0.05 ppb, 0.001 ppb, 0.0001 ppb or 0.00005 ppb; and a total concentration of $^{13}C$ equal to or less than 0.9%, 0.7%, 0.4% 0.1%, 0.01%, or 0.001%.

Such an optical element can be formed using the first aspect of the invention with the first and second portions of the optical device being formed from the first and second layers of single crystal diamond material grown in accordance with the first aspect. Embodiments of the invention provide a free standing diamond optical structure for increasing optical coupling into and out of the diamond material forming the optical structure. The optical structure may be, for example, a diamond lens or more specifically a diamond solid immersion lens (SIL).

According to a third aspect of the present invention there is provided a free standing diamond lens comprising at least a portion of single crystal diamond material having one or both of: a single substitutional nitrogen concentration equal to or less than 20 ppb; and a total concentration of $^{13}C$ equal to or less than 0.9%.

According to a fourth aspect of the present invention there is provided a diamond solid immersion lens (SIL) comprising at least a portion of single crystal diamond material having one or both of: a single substitutional nitrogen concentration equal to or less than 20 ppb; and a total concentration of $^{13}C$ equal to or less than 0.9%. The SIL may form a hemisphere, a super-hemisphere, a truncated hemisphere, an oval, or an aspherical shape. Such a diamond SIL can be formed using a method according to the first aspect of the invention in which case the SIL may be formed from the second single crystal diamond layer alone or from both the first and second layers grown in accordance with the first aspect.

Embodiments of the present invention have a range of applications. For example, certain embodiments may be used in applications that utilize a diamond material's quantum spin properties such as, for example, in a diamond detector (e.g. a diamond magnetometer).

BRIEF DESCRIPTION OF THE DRAWINGS

For a better understanding of the present invention and to show how the same may be carried into effect, embodiments of the present invention will now be described by way of example only with reference to the accompanying drawings, in which.

DETAILS DESCRIPTION OF CERTAIN EMBODIMENTS

Figure 1:
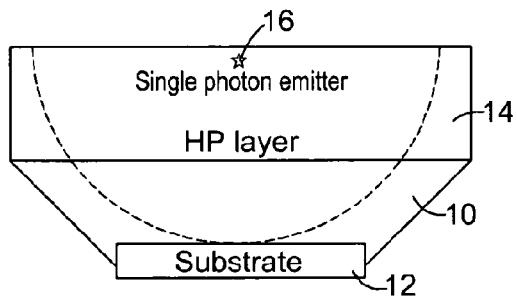
FIG. 1 shows an embodiment of the present invention in which a first layer of nitrogen doped single crystal diamond material (N doped layer) is grown via a CVD technique on a substrate and a second layer of high purity single crystal diamond material (HP layer) is grown on the first layer. The dotted line indicates how a diamond SIL can be formed comprising portions of the first and second layer by, for example, laser cutting. A single photon emitter is provided at or near a focal point of the diamond SIL.

Certain embodiments of the present invention provide an optical element comprising at least a portion of quantum grade diamond material and an out-coupling structure at a surface of the optical element for increasing out-coupling of light from the quantum grade diamond material. The quantum grade diamond material is grown in a very low nitrogen environment and/or a very low $^{13}C$ environment. Furthermore, at least a portion of the surface of quantum grade material preferably has a low surface roughness. Such materials are discussed in WO 2010010344 and WO 2010010352. However, the growth of such quantum grade diamond material needs to be very carefully controlled. Furthermore, the low nitrogen content results in low lateral growth from a substrate. This contrasts with lower quality diamond grown in a higher nitrogen content environment in which diamond can undergo significant lateral growth and can be grown at higher rates. As such, the present invention proposes to use a multistage growth process in which a first layer of lower quality single crystal diamond material is grown in a relatively high nitrogen content environment to encourage lateral growth at relatively high growth rates followed by a second growth stage in which the gas phase is changed to form a high quality quantum grade diamond material over the first layer.

Such a method allows a larger volume of quantum grade diamond material to be grown relative to a single stage process. As such, it is possible to form an optical element comprising the quantum grade diamond material of a larger size such that an out-coupling structure can be more readily formed at a surface of the optical element for increasing out-coupling of light from the quantum grade diamond material. Alternatively, a plurality of optical elements can be formed from the same piece of quantum grade material due to the increase in the lateral dimensions of the quantum grade diamond material achieved by the method of the present invention.

The out-coupling structure may be formed after formation of the diamond body of the optical element or it may be formed during formation of the diamond body of the optical element as an integral part of the process for forming the diamond body of the optical element. The out-coupling structure may, for example, be formed in a diamond surface of the optical element, i.e. the out-coupling structure is integrally formed by a diamond surface of the optical element.

The surface of the optical element at which the out-coupling structure is formed and/or a surface of the optical element opposite to said surface can be formed by one of the following crystallographic planes: {100}; {110}; {111}; {113}, or substantially close to one these planes (for example, less than or equal to 10°, 8°, 5°, 2°, 1°, or 0.5° from one of the aforementioned crystallographic planes). A {111} plane is preferred as it has been found that such an orientation leads to an increase in light out-coupling.

The out-coupling structure may comprise one or more of: a convex surface; a microlens array; a solid immersion lens (SIL); a plurality of surface indentations or nano-structures; a diffraction grating; a fresnel lens; and a coating such as an antireflective coating. Furthermore, the out-coupling structure can be positioned to increase out-coupling of light from the high quality single crystal diamond material. For example, the out-coupling structure can increase collection efficiency by a factor equal to or greater than 3, 4, 5, 6, 7, 10, or 15 times.

The method of the present invention allows such out-coupling structures to be more readily formed in, on, or by high quality single crystal diamond material by making it possible to form larger pieces of high quality single crystal diamond material. For example, using the method of the present invention it is possible to form a solid immersion lens from very high quality single crystal diamond material, for example, quantum grade single crystal diamond material. WO2007/007126 discloses a method of forming a single crystal diamond into a SIL having a smooth surface. The present method makes it easier to manufacture larger single crystal diamond SILs and/or SILs of a higher grade single crystal diamond.

It is envisaged that according to certain embodiments, the optical element is formed from the second layer of single crystal diamond material alone, without incorporating any of the first layer of lower grade single crystal diamond material. In this case, the first growth stage functions to form a larger base on which the second layer of higher quality single crystal material is grown. However, according to certain preferred embodiments the optical element is formed from at least a portion of both the first and second layers. In this case, the out-coupling structure can be formed, at least in part, in the portion of the optical element formed from the first layer of lower grade single crystal diamond. Such embodiments are particularly clever as they result in less high grade material being removed during formation of an out-coupling structure and/or less high grade material being required to form an out-coupling structure in the optical element. Such embodiments provide a composite diamond optical element comprising a portion of higher grade diamond material and a portion of lower grade diamond material in which an optical out-coupling structure is integrally formed. This avoids the additional difficulty, time, and expense required to grow a piece of higher quality diamond material which is sufficiently large to form an out-coupling structure in a surface thereof. The need to remove significant quantities of very expensive high grade material to form an out-coupling structure is also avoided.

The first layer is advantageously grown to a thickness equal to or greater than 0.25 mm, 0.5 mm, 1 mm, 1.25 mm, 1.5 mm, 2 mm or 5 mm. As the first layer grows, the external crystal morphology may rotate by 45°. That is, the single crystal diamond develops sides rotated by 45° relative to sides of the substrate and passing near to corners of the substrate. This rotation is well known in the art. Lateral growth occurs during this growth phase until the single crystal diamond is fully rotated after which significant lateral growth does not occur. It is advantageous that the first layer is grown to full rotation prior to growing the second layer so as to maximize lateral growth in the first growth stage and thus increase the size of the higher grade single crystal diamond growth thereon in the second growth stage.

In relation to the above, it will be evident that it is desirable to maximize the lateral dimensions of the second layer of high quality material relative to the size of the substrate on which the first and second layers are grown using a chemical vapour deposition technique. This is achieved by altering the growth chemistry such that a higher nitrogen concentration is utilized to encourage lateral CVD diamond growth and then a lower nitrogen concentration is used to form a high quality diamond layer. In addition to changing the growth chemistry, a substrate geometry can be selected to increase the ratio of the size of the CVD diamond material relative to the substrate. One particularly preferred manner of achieving this is to utilize a single crystal diamond substrate which has a growth surface having an aspect ratio of at least 1.3:1. CVD growth to provide a diamond material with enhanced lateral dimensions compared to those of a starting substrate can be achieved from a base substrate having a growth surface with such an aspect ratio. For example, the method may comprise growing a single crystal diamond material comprising: providing a diamond substrate which presents a (001) major surface, which major surface is bounded by at least one <100> edge the length of which exceeds any dimension of the major surface that is orthogonal to the said at least one <100> edge by a ratio of at least 1.3:1; and growing diamond material homoepitaxially on the (001) major surface of the diamond material surface under CVD synthesis conditions, the diamond material growing both normal to the major (001) surface, and laterally therefrom. For example, the substrate may provide a rectangular substrate growth surface with side lengths a, b (where a>b) such that the aspect ratio a/b is equal to or greater than 1.3.

The second layer advantageously has a thickness equal to or greater than 0.1 µm, 1 µm, 10 µm, 100 µm, 200 µm, 500 µm, or 1 mm. It is useful to grow the second layer to at least these thicknesses to provide a sufficient large portion of high quality diamond material in the final optical element. For some quantum applications, the single photon source is advantageously located at a distance equal to or greater than 0.1 µm, 1 µm, 10 µm, 100 µm, 200 µm, or 500 µm from the lower grade material of the first layer as the T2 time for the single photon source can be reduced by impurities and defects in the lower grade material if positioned too close to the single photon source. Accordingly, in such arrangements the second layer should preferably be thick enough to sufficiently space the single photon source from the lower grade diamond material.

One or more single photon emitters may be grown into the second layer of single crystal diamond material. Alternatively, the method may comprise implanting one or more single photon emitters into the second layer of single crystal diamond material after growth. Alternatively still, the method may comprise growing a third layer over the second layer. In this case, one or more single photon emitters can be disposed in the third layer.

The aforementioned method can be utilized to manufacture an optical element comprising: a first portion of single crystal diamond material having first single substitutional nitrogen concentration; a second portion of single crystal diamond material coupled to the first portion, the second portion having a second single substitutional nitrogen concentration which is lower than the first single substitutional nitrogen concentration; and an out-coupling structure formed at a surface of the optical element for increasing out-coupling of light.

The first and second portions may form first and second layers within the optical element. The optical element is preferably a free-standing element comprising the first and second portions of single crystal diamond material and the out-coupling structure. Further components may be provided in the optical element. For example, a mirror such as a Bragg mirror may be disposed on an opposite side of the second portion to the first portion.

Preferably, at least a portion of the out-coupling structure is integrally formed in the first portion of lower grade single crystal diamond material. In certain embodiments the entire out-coupling structure may be formed in the lower grade single crystal diamond material. The out-coupling structure may be any one of those described in relation to the first aspect of the invention.

For quantum applications, the second portion of higher grade single crystal diamond material is formed of a single crystal diamond material having one or more of: a single substitutional nitrogen concentration equal to or less than 20 ppb, 10 ppb, 5 ppb, 1 ppb or 0.5 ppb; an NV$^-$ concentration equal to or less than 0.15 ppb, 0.1 ppb, 0.05 ppb, 0.001 ppb, 0.0001 ppb, or 0.00005 ppb; and a total concentration of $^{13}$C equal to or less than 0.9%, 0.7%, 0.4% 0.1%, 0.01%, or 0.001%.

The first portion can be a generally lower grade material and comprises a single crystal diamond material having a single substitutional nitrogen concentration equal to or greater than 30 ppb, 50 ppb, 100 ppb, 200 ppb, 300 ppb, 500 ppb, 700 ppb, or 800 ppb and/or an NV$^-$ concentration equal to or greater than 0.1 ppb, 0.3 ppb, 0.5 ppb, 1 ppb, 2 ppb, 3 ppb, 5 ppb, 7 ppb, or 8 ppb. For example, the first portion may have a single substitutional nitrogen concentration greater that the second portion by a factor of at least 5, 10, 20, 50, 100, 500, 1000, or 10000. However, for optical applications the nitrogen concentration of the lower grade material should not be so high as to detrimentally affect the optical element in its intended use. Accordingly, the first portion of single crystal diamond material has a single substitutional nitrogen concentration equal to or less than 5 ppm, 2 ppm, or 1 ppm and/or an NV$^-$ concentration equal to or equal to or less than 50 ppb, 20 ppb, or 10 ppb. The first portion of lower grade material will also preferably have a total concentration of $^{13}$C greater than 0.9% and most preferably a natural isotopic abundance of $^{13}$C relative to $^{12}$C. While isotopically enriched material is advantageous for quantum grade material to increase the T2 time, it is expensive and therefore can be avoided for other portions of the optical element which are not required to be of a quantum grade. As such, it is advantage to provide a $^{13}$C concentration which differs between the first and second portions.

According to certain embodiments, the first portion of single crystal diamond material may comprise optical grade material as disclosed in WO 2004/046427. This material may be provided to ensure good optical characteristics for the optical element. For example, the first portion of single crystal diamond material may have a low and uniform optical absorption such that a sample of a specified thickness of at least 0.5 mm has an optical absorption coefficient at a wavelength of 1.06 µm of equal to or less than 0.09 cm$^{-1}$ or 0.05 cm$^{-1}$.

The optical element is preferably formed of a single crystal diamond including both the first and second layers whereby the first and second layers are coupled together by being incorporated into the single crystal diamond. However, it is also envisaged that a composite optical element can be formed in which the first and second layers are separate and distinct single crystals which are coupled together by van der Waals forces, a clamping arrangement, or via an intermediate adhesive material disposed between the first and second layers.

According to one particularly preferred embodiment, the out-coupling structure is a convex surface which is formed by the first and second portions of single crystal diamond material, the first portion forming a spherical cap and the second portion forming a spherical segment or spherical frustum. Such an arrangement may form a composite single crystal diamond solid immersion lens (SIL).

For quantum applications, the optical element of embodiments of the present invention may comprise one or more single photon emitters having a decoherence time T2 equal to or greater than 0.05 ms, 0.1 ms, 0.3 ms, 0.6 ms, 1 ms, or 5 ms. The one or more single photon emitters may be selected from the group consisting of: NV$^-$ defects; Si related defects; Ni related defects; and Cr related defects. NV$^-$ defects are preferred. Spin defects, for example NV$^-$, can be grown in or created through implantation techniques as is known in the art. There are several distinguishing characteristics associated with NV⁻ defects produced using implantation and annealing rather than growth alone. These include, for example, the presence of the vacancy centre (GR1) at 741 nm, which is a by-product of the implantation route for making NV⁻ defects.

The one or more single photon emitters may be disposed in the second portion of single crystal diamond material. Optionally, the optical element may comprise a third portion of single crystal diamond material coupled to the second portion on an opposite side to the first portion. This may be formed, for example, by growing a third layer over the second layer in accordance with embodiments of the first aspect of the invention. In this case, the one or more single photon emitters can be disposed in the third portion of single crystal diamond material within the optical element.

A particularly preferred arrangement provides a diamond solid immersion lens (SIL) comprising at least a portion of single crystal diamond material having one or both of: a single substitutional nitrogen concentration equal to or less than 20 ppb; and a total concentration of $^{13}C$ equal to or less than 0.9%. High grade single crystal diamond material comprising a low nitrogen concentration and/or a low $^{13}C$ content increases decoherence times for a single photon emitter. Furthermore the SIL structure increases out-coupling of light. As such, this structure has been found to be ideal for quantum applications. Such a SIL may also comprise a portion of lower grade single crystal diamond material in accordance with the previously described composite optical elements. Alternatively, the body of the SIL may be formed only, or at least substantially or essentially, of high grade single crystal diamond material. The diamond SIL can be formed using a method according to the first aspect of the invention in which case the SIL may be formed from the second single crystal diamond layer alone or from both the first and second layers grown in accordance with the first aspect. The materials used for this aspect of the invention may be the same as those previously described in relation to the method of the first aspect of the invention and the composite optical element of the second aspect of the invention. For example, the SIL may have one or more of the following characteristics:

(a) the diamond SIL may be a hemisphere, a super-hemisphere, a truncated hemisphere, an oval, or an aspherical shape;

(b) the diamond SIL may comprise a flat surface formed by one of the following crystallographic planes: {100}; {110}; {111}; or {113}, preferably {111}, or within 10°, 8°, 5°, 2°, 1°, or 0.5° from one of the aforementioned crystallographic planes;

(c) at least a portion of the diamond SIL may be formed of a single crystal diamond material having one or more of: a single substitutional nitrogen concentration equal to or less than 15 ppb, 10 ppb, or 5 ppb; a NV⁻ concentration equal to or less than 0.15 ppb, 0.1 ppb, 0.05 ppb, 0.001 ppb, 0.0001 ppb, or 0.00005 ppb; and a total concentration of $^{13}C$ equal to or less than 0.7%, 0.4% 0.1%, 0.01%, or 0.001%;

(d) the diamond SIL may comprise one or more single photon emitters having a decoherence time T2 equal to or greater than 0.05, 0.1 ms, 0.3 ms, 0.6 ms, 1 ms, or 5 ms, wherein the one or more single photon emitters may be selected from the group consisting of: NV⁻ defects; Si 737 nm defects; Ni defects; Cr defects; and Co defects;

(e) the one or more single photon emitters may be disposed in the low N/low $^{13}C$ portion of material and may be located at a lateral distance equal to or less than 30 µm, 20 µm, 10 µm, or 5 µm from a central rotational axis of the diamond SIL;

(f) the diamond SIL may further comprise a layer of single crystal diamond material coupled to said portion of single crystal diamond material on a flat side thereof, and the one or more single photon emitters may be disposed in said layer of single crystal diamond material.

Optical detection of single atom emitters in a solid is a key element of new technologies including generation of single photons on demand and quantum information processing. Brightness of such atomic emitters is usually low and limited by their intrinsic photophysical parameter and detection losses of collection optics. Engineering optical elements like metallic nanoantennaes and photonic wire microcavities are proven to be crucial for engineering a single photon quantum interface. The present invention provides a novel simple approach that uses standard optical elements integrated into diamond material hosting single dopants. For example, by building a solid immersion lens in quantum grade single crystal diamond, the collection efficiency for single nitrogen-vacancy defects has been improved by an order of magnitude. This provides an enhancement over existing diamond based single photon sources and improved sensitivity for diamond magnetic field sensors based on single spins.

Embodiments of the present invention can provide: controllable position single defect emitters; single emitters in a good environment (i.e. minimized surface and other extended damage and low point defect density); and improved photon collection from these single emitters.

FIG. 1 shows an embodiment of the present invention in which a first layer 10 of nitrogen doped single crystal diamond material (N doped layer) is grown via a CVD technique on a substrate 12 and a second layer 14 of high purity single crystal diamond material (HP layer) is grown on the first layer 10. The dotted line indicates how a diamond SIL can be formed comprising portions of the first and second layer by, for example, laser cutting. A single photon emitter 16 is provided at or near a focal point of the diamond SIL.

Such an arrangement is grown using a multi-stage CVD growth process. A first growth stage uses nitrogen addition to the process chemistry. This has the following benefits: increased growth rate affecting economics and volume production; increased lateral growth, fitting well with the final structure geometry; and reduced strain and issues associated with early stage growth. A second growth stage may be provided either in situ after the first growth stage or via a stop and re-start consistent with a reprocessing stage to deposit a high purity layer on top of the nitrogen doped layer. This gives a layer: consistent with single defects being resolved using confocal microscopy; diamond material consistent with good material properties, i.e. the single centres are in an "excellent crystal environment", meaning low strain, low defects, low spin defects; and good material properties such that the single photon emitters have a long decoherence time and are spectrally stable.

In relation to the above, one advantage of providing the second growth stage in situ after the first growth stage, rather than via a stop and re-start, is to provide a smooth process transition between the growth stages and a better quality interface between the layers.

In the first growth stage the nitrogen content in the gas within the CVD reactor may be less than 5 parts per million, less than 2 parts per million, or less than 1.5 parts per million. The nitrogen content within the CVD reactor gas may be more than 300 parts per billion, preferably more than 400 parts per billion, preferably more than 500 parts per billion, preferably more than 600 parts per billion preferably more than 700 parts per billion, preferably more than 800 parts per billion, preferably more than 1000 parts per billion.

A further property that can be controlled by utilising a multi-stage growth process within CVD production of diamond is the relative growth rates in different crystallographic directions. Such relative growth rates can be characterised by a parameter, α. The parameter α is defined as $$\alpha = \frac{\sqrt{3} \times R_{\langle 001 \rangle}}{R_{\langle 111 \rangle}}$$

where $R_{\langle 001 \rangle}$ is the growth rate in the <001> direction and $k_{\langle 111 \rangle}$ is the growth rate in the <111> direction. The parameter α can be controlled by specific CVD reactor conditions, such as the gas pressure, gas temperature, chemical composition of the gas (including nitrogen concentration) and the substrate temperature. Therefore by knowing the crystallographic orientation of the single crystal diamond that is being deposited (commonly dictated by the crystallographic orientation of the substrate) and by varying one of the CVD reactor conditions that influence α, it is possible to exert some control over the evolution of the geometry of the diamond that is deposited. The α parameter for the first growth stage may be in the range 1.4 to 2.6, 1.6 to 2.4, 1.8 to 2.2, or 1.9 to 2.1.

The nitrogen content influences the parameter α. During the first growth stage the presence of nitrogen minimises the formation of dislocations and also promotes growth along the <100> directions. Therefore when using a substrate with a major {100} growth face and {100} side faces, it is possible, when growing homoepitaxially, for the deposited diamond to grow so that the major growth face is larger than that of the substrate. When the nitrogen content of the gas within the CVD reactor is decreased, although the lateral growth rate is decreased, further deposition occurs onto this enlarged growth surface. This means that a subsequent stage that is used to deposit the CVD single crystal diamond material of an embodiment of the present invention has dimensions which are not constrained to correspond to those of the substrate. The transition from one stage to the next can be chosen to occur when the stages of growth prior to the stage of growth that produces the high purity CVD single crystal diamond material of an embodiment of the present invention have achieved the desired increase in the growth surface area.

This ability to increase the growth surface area before depositing high purity CVD single crystal diamond material results in the CVD single crystal diamond material possessing a reduced dislocation density, reduced nitrogen content and an increased dimension compared to commonly available substrates.

In the second growth stage the nitrogen content in the gas within the CVD reactor may be less than 250 parts per billion, preferably less than 200 parts per billion, preferably less than 150 parts per billion, preferably less than 120 parts per billion. The decreased nitrogen content in the gas within the CVD reactor results in a decreased nitrogen content within the CVD single crystal diamond material, and therefore a lower absorption coefficient and longer decoherence times. The nitrogen content within the CVD reactor gas may be more than 0.001 parts per billion, more than 0.01 parts per billion, more than 0.1 parts per billion, more than 1 part per billion, or more than 10 parts per billion.

The second stage growth process may use source gases of high isotopic purity in addition to high chemical purity. For example the carbon source gas may have a $^{12}C$ fraction increased so as to be equal to or greater than 99%, 99.3%, 99.6%, 99.9%, 99.99%, or 99.999%. This can further increase the decoherence time of the single photon emitters. The gas composition might also include other impurities related to the formation of colour centres or their charge stabilization such as, for example, silicon or phosphorous. However, according to certain embodiments in addition to low nitrogen concentrations, the second growth stage preferably also has very low concentrations of other impurities which may be incorporated into the single crystal diamond during CVD growth such that the second layer may preferably have one or more of: a boron concentration of 100 ppb or less; a silicon concentration of 100 ppb or less; a concentration of paramagnetic defects of 1 ppm or less; a concentration of any single non-hydrogen impurities of 5 ppm or less; a total impurity content excluding hydrogen and its isotopes of 10 ppm or less; and a concentration of hydrogen impurities in the single crystal diamond host material of $10^{18}$ cm$^{-3}$ or less. The high purity material preferably also has a low concentration of dislocations. For example, the high purity single crystal diamond material may contain a dislocation bundle density equal to or less than: $10^6$ dislocations cm$^{-2}$; $10^4$ dislocations cm$^{-2}$; $3 \times 10^3$ dislocations cm$^{-2}$; $10^3$ dislocations cm$^{-2}$; $10^2$ dislocations cm$^{-2}$; or 10 dislocations cm$^{-2}$. This can be achieved by careful substrate preparation and the use of nitrogen in the first growth stage to inhibit the formation of dislocations which would otherwise propagate into the second layer of high purity single crystal diamond.

It is also desirable to process a surface of the diamond host material so as to achieve a low surface roughness Rq. As described in WO 2010010344 and WO 2010010352, high T2 values and high spectral stability can be obtained using the synthetic diamond material of the present invention as a host material where the quantum spin defect is to be positioned at a distance of equal to or less than 100 μm from such a processed surface. According to embodiments of the present invention the quantum spin defect should preferably be positioned at a distance of equal to or less than 100 μm, preferably 50 μm, preferably 20 μm, preferably 10 μm, preferably 1 μm, preferably 500 nm, preferably 200 nm, preferably 50 nm, preferably 20 nm, or preferably 10 nm from such a processed surface. This positioning of the quantum spin defect means that it is readily accessible for end applications such that it can be characterised and "read out", for example, by optical coupling to a waveguide. Thus, it is advantageous to form the quantum spin defect (single photon source) in the quantum grade single crystal diamond, wherein a surface of the diamond material is processed such that the surface roughness, Rq of the single crystal diamond within an area defined by a circle of radius of about 5 μm centred on the point on the surface nearest to where the quantum spin defect is formed is equal to or less than about 10 nm, 5 nm, 1 nm, or 0.5 nm. The surface may be processed before or after forming the quantum spin defect. In the SIL arrangement discussed herein, the quantum spin defect is formed close to the flat surface of the SIL at, or close to, the centre of the flat surface. Accordingly, the flat surface should be processed at least in a portion adjacent the quantum spin defect to have a low surface roughness.

In additional to low surface roughness at a surface near a quantum spin defect, it is also useful to ensure that sub-surface damage is low near a quantum spin defect/single photon emitter. Sub-surface damage may be reduced by etching, such as with a plasma etch. It may also be useful to control the type of surface termination at a diamond surface near the quantum spin defect to ensure that the diamond is not terminated with a species which will adversely interact with the quantum spin defect. For example, it may be useful to ensure that the diamond surface near the quantum spin defect is terminated with a spin-zero species such as oxygen rather than a species which has a non-zero spin such as hydrogen.

It is also advantageous to process a surface of the out-coupling structure to have low surface roughness to improve optical performance. WO2007/007126 discloses a method of forming a SIL with a low surface roughness. The convex surface of the SIL may have at least one, preferably two, more preferably three, more preferably still four, and most preferably five of the following properties outlined below:

(i) The convex surface includes a spherical segment in which the maximum peak to valley deviation from a perfect spherical segment is equal to or less than about 5 µm, more preferably equal to or less than about 3 µm, yet more preferably equal to or less than about 2 µm, more preferably equal to or less than about 1.5 µm, more preferably equal to or less than about 1 µm, more preferably equal to or less than about 500 nm, still more preferably equal to or less than about 300 nm, more preferably equal to or less than about 200 nm, yet more preferably equal to or less than about 100 nm and yet more preferably equal to or less than about 50 nm, and most preferably equal to or less than 20 nm.

(ii) The convex surface includes a spherical segment, wherein the root mean square (RMS) deviation of the spherical segment, as measured by averaging over the square of deviations over the spherical segment from an ideal sphere, is equal to or less than about 500 nm, more preferably equal to or less than about 250 nm, more preferably still equal to or less than about 100 nm, yet more preferably equal to or less than about 60 nm, even more preferably equal to or less than about 40 nm, more preferably equal to or less than about 20 nm and most preferably equal to or less than about 10 nm.

(iii) The convex surface has a root mean square surface roughness (Rq, as defined in 'Tribology', I M Hutchings, published by Edward Arnold, 1992, pages 8-9) of less than about 30 nm, preferably 10 nm, more preferably 5 nm, yet more preferably 3 nm, and more preferably 1.5 nm.

(iv) The radius of curvature of the convex surface is less than about 20 mm, preferably less than about 10 mm, more preferably less than about 5 mm, yet more preferably less than about 2 mm, yet more preferably less than about 1 mm, yet more preferably less than about 0.5 mm and yet more preferably less than about 0.2 mm.

(v) The convex surface includes a spherical segment with a conical half-angle greater than about 10°, preferably greater than about 20°, more preferably greater than about 40°, yet more preferably greater than about 60°, more preferably greater than about 80°, more preferably still greater than about 90°, yet more preferably greater than about 110°, more preferably greater than about 130°, and most preferably greater than about 160°.

A single photon emitter might be produced in a number of different ways. For example: it may be grown in prior to processing to form the SIL; it may be implanted following fabrication of the flat of the SIL (before or after the round part of the SIL is polished); or it may be grown in a thin layer on the flat of the SIL having been already processed (before or after polishing)

The flat face of the SIL can be formed by one of the following crystallographic planes: {100}; {110}; {M}; {113}, or substantially close to one these planes (for example, less than or equal to 10°, 8°, 5°, 2°, 1°, or 0.5° from one of the aforementioned crystallographic planes). A {111} plane is preferred as it has been found that such an orientation leads to an increase in light out-coupling. A Bragg mirror may be attached, deposited, or etched onto the flat surface of the SIL.

Furthermore, the SIL may comprise a third layer of single crystal diamond (not shown) disposed over the second layer. The third layer may be grown in situ or after a stop and one or more processing step such as a plasma etch to prepare the growth surface for further growth stages. The third layer may be nitrogen doped and/or isotopically enriched. Further growth stages may also be provided either before, in between, or after the three growth stages discussed herein.

Figure 2:
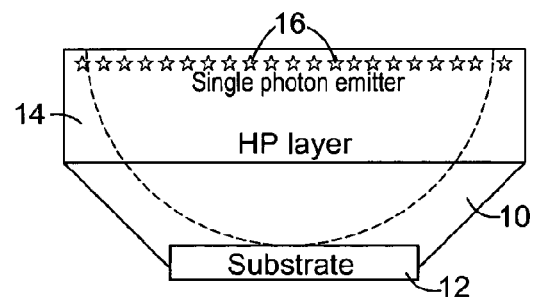
FIG. 2 shows a similar arrangement to FIG. 1 but with a plurality of single photon emitters disposed in a line near a base of the diamond SIL.
Figure 3:
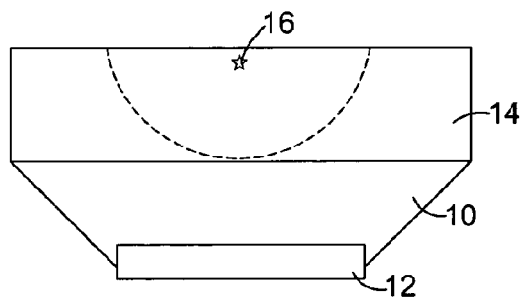
FIG. 3 shows an alternative embodiment in which a diamond SIL is formed exclusively from the second layer of high purity single crystal diamond material.
Figure 4:
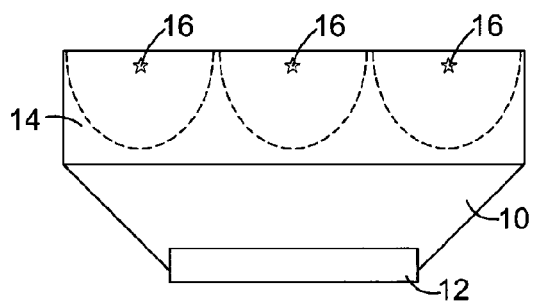
FIG. 4 shows an alternative embodiment in which a plurality of diamond SILs are formed from the second layer of high purity single crystal diamond material.

FIG. 2 shows a similar arrangement to FIG. 1 but with a plurality of single photon emitters disposed in a line near a base of the diamond SIL. FIG. 3 shows an alternative embodiment in which a diamond SIL is formed exclusively from the second layer of high purity single crystal diamond material. FIG. 4 shows another alternative embodiment in which a plurality of diamond SILs are formed from the second layer of high purity single crystal diamond material. In all these Figures like reference numerals are used for like parts.

Figure 5:
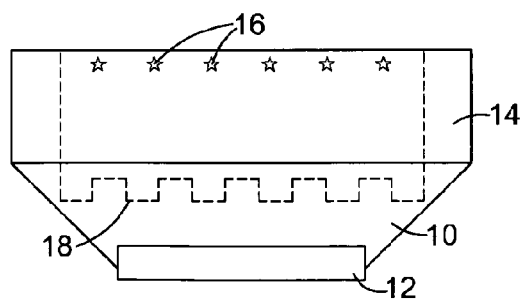
FIG. 5 shows an alternative embodiment in which an optical element is formed from a portion of the first and second layers with the dotted line indicating a diffraction grating to be cut into the first layer.

FIG. 5 shows a different embodiment in which an optical element is formed with a diffraction grating 18 rather than being formed into a diamond SIL. In this arrangement the optical element is formed from a portion of the first and second layers 10, 14 with a diffraction grating 18 formed in the first layer. The dotted structure may be cut from the bi-layer of single crystal diamond and surface processed.

Measurement Techniques

Single-substitutional nitrogen in the neutral charge state content is measured by using electron paramagnetic resonance (EPR). Whilst the method is well-known in the art, for completeness, it is summarised here. In measurements conducted using EPR, the abundance of a particular paramagnetic detect (e.g. the neutral single-substitutional nitrogen defect) is proportional to the integrated intensity of all the EPR absorption resonance lines originating from that centre. This permits the concentration of the defect to be determined by comparing the integrated intensity to that which is observed from a reference sample, provided care is taken to prevent or correct for the effects of microwave power saturation. Since continuous wave EPR spectra are recorded using field modulation, double integration is required to determine the EPR intensity and hence the defect concentration. To minimise the errors associated with double integration, base line correction, finite limits of integration, etc., especially in cases where overlapping EPR spectra are present, a spectral fitting method (using a Nelder-Mead simplex algorithm (J. A. Nelder and R. Mead, The Computer Journal, 7 (1965), 308)) is employed to determine the integrated intensity of the EPR centres present in the sample of interest. This entails fitting the experimental spectra w simulated spectra of the defects present in the sample and determining the integrated intensity of each from the simulation. Experimentally it is observed that neither a Lorentzian nor Gaussian line shape provides a good fit to the experimental EPR spectra, therefore a Tsallis function is used to produce the simulated spectra (D. F. Howarth, J. A. Weil, Z. Zimpel, J. Magn. Res., 161 (2003), 215). Furthermore, in the case of low nitrogen concentrations, it is often necessary to use modulation amplitudes approaching or exceeding the line width of the EPR signals to achieve a good signal/noise ratio (enabling accurate concentration determination within a reasonable time frame). Hence pseudo-modulation is employed, with the Tsallis line shape in order to produce a good fit to the recorded EPR spectra (J. S. Hyde, M. Pasenkiewicz-Gierula, A. Jesmanowicz, W. E. Antholine, Appl. Magn. Reson., 1 (1990), 483). Using this method the concentration can be determined with a reproducibility of better than ±5%.

The concentration of single-substitutional nitrogen in the neutral charge state present in the synthetic CVD single crystal diamond material of the present invention may also be measured using the 270 nm peak using UV-visible absorption spectroscopy. The technique of UV-visible absorption spectroscopy is well-known in the art.

The concentration of single-substitutional nitrogen in the neutral charge state in the synthetic CVD single crystal diamond material may be found by measuring infrared absorption peaks at wavenumbers of 1332 cm$^{-1}$ and 1344 cm$^{-1}$. Using a spectrometer with a resolution of 1 cm$^{-1}$, the conversion factors between the absorption coefficient values in cm$^{-1}$ for the peaks at 1332 cm$^{-1}$ and 1344 cm$^{-1}$ and the concentrations of single nitrogen in the positively-charged and neutral states respectively are 5.5 (S. C. Lawson et al., J. Phys. Condens. Matter, 10 (1998), 6171-6181) and 44. However, it must be noted that the value derived from the 1332 cm$^{-1}$ peak is only an upper limit.

Alternatively, the total concentration of nitrogen may be determined using secondary ion mass spectroscopy (SIMS). SIMS has a lower detection limit for nitrogen in diamond of approximately 0.1 ppm and its use is well-known in the art. For synthetic diamond produced by a CVD method, the vast majority of nitrogen present in the solid is in the form of neutral single substitutional nitrogen, and therefore, whilst SIMS measurements of the total nitrogen concentration inevitably provide an upper limit to the concentration of single-substitutional nitrogen in the neutral charge state, they typically also provide a reasonable estimate of its actual concentration.

Fluorescence of single NV centres can be measured using a confocal microscope equipped with high sensitivity avalanche photodetectors and a 532 nm laser as an excitation source. In order to separate the fluorescence of a single colour centre from scattered and reflected laser light, a long pass filter (650 nm) may be placed in the detection channel. Scanning of a SIL can be performed using an actively stabilized piezo stage. Experiments can be performed under ambient conditions. The concentration of NV$^-$ can then be determined using simple counting methods. This technique is useful for calculating the concentration of NV$^-$ centres at levels typically less than $10^{13}$ cm$^{-3}$. Higher concentrations might in some cases (where there is a uniform concentration) be determined using ensemble EPR measurements, using the W15 EPR centre which is an EPR signature of the NV$^-$ defect.

Example Synthesis

A synthetic type Ib HPHT diamond plate with a pair of approximately parallel major faces within approximately 5° of (001) was selected. The plate was fabricated into a square substrate suitable for homoepitaxial synthesis of single crystal CVD diamond material by a process including the following steps:

i) laser cutting of the substrate to produce a plate with all <100> edges;

ii) lapping and polishing the major surface upon which growth is to occur, the lapped and polished part having dimensions about 3.6 mm×3.6 mm by 535 µm thick, with all faces {100}.

The defect level at or below the substrate surface is minimised by careful preparation of the substrate as disclosed in EP 1 292 726 and EP 1 290 251. It is possible to reveal the defect levels being introduced by this processing by using a revealing plasma etch. It is possible routinely to produce substrates in which the density of defects measurable after a revealing etch is dependent primarily on the material quality and is below 5×10$^3$ mm$^{-2}$, and generally below 10$^2$ mm$^{-2}$. The substrate was mounted onto a substrate carrier. The substrate and its carrier were then introduced into a CVD reactor chamber and an etch and growth cycle commenced by feeding gases into the chamber as follows.

First, an in situ oxygen plasma etch was performed at a pressure of 165 Torr and a substrate temperature of 803° C., followed by a hydrogen etch, oxygen being removed from the gas flow at this stage. Then the first stage growth process was started by the addition of methane at 40 sccm (standard cubic centimeter per minute). Nitrogen was added to achieve a level of 700 ppb in the gas phase. Hydrogen was also present in the process gas. The substrate temperature at this stage was 866° C. The methane content was then increased to 175 sccm. These growth conditions were selected to give an a parameter value in the range of 2.0±0.2, based on previous test runs.

After the stage 1 growth layer reached a thickness of 1.7 mm, the stage 2 growth was commenced by removing the nitrogen which had been added to the gas phase. Growth was terminated after the stage 2 growth layer reached a thickness of 0.9 mm.

Study of the grown CVD diamond plate revealed that it was substantially free of twins and cracks on the (001) face, and bounded by <110> sides and post-synthesis dimensions of the twin free top (001) face were increased to 5.4 mm×5.4 mm.

The CVD diamond material was then processed into a diamond SIL using a method as that described in WO2007/007126.

Analysis

Theoretical

Using geometrical optics and Fresnel's reflection laws, the photon collection efficiencies from a single emitter in diamond have been calculated with and without a diamond SIL used as primary collection optic. For a single emitting dipole oriented parallel to a flat diamond surface, the normalized photoluminescence intensity $I_s$ (resp. $I_p$) having s (resp. p) polarization can be written as $$I_s \propto \frac{3}{8\pi}[1 - \sin^2(\theta)\cos^2(\phi)]\sin^2(\phi) \tag{1}$$

$$I_p \propto \frac{3}{8\pi}[1 - \sin^2(\theta)\cos^2(\phi)]\cos^2(\phi), \tag{2}$$

where $\theta$ is the emission angle and $\phi$ the azimutal angle measured from the dipole axis.

Figure 6:
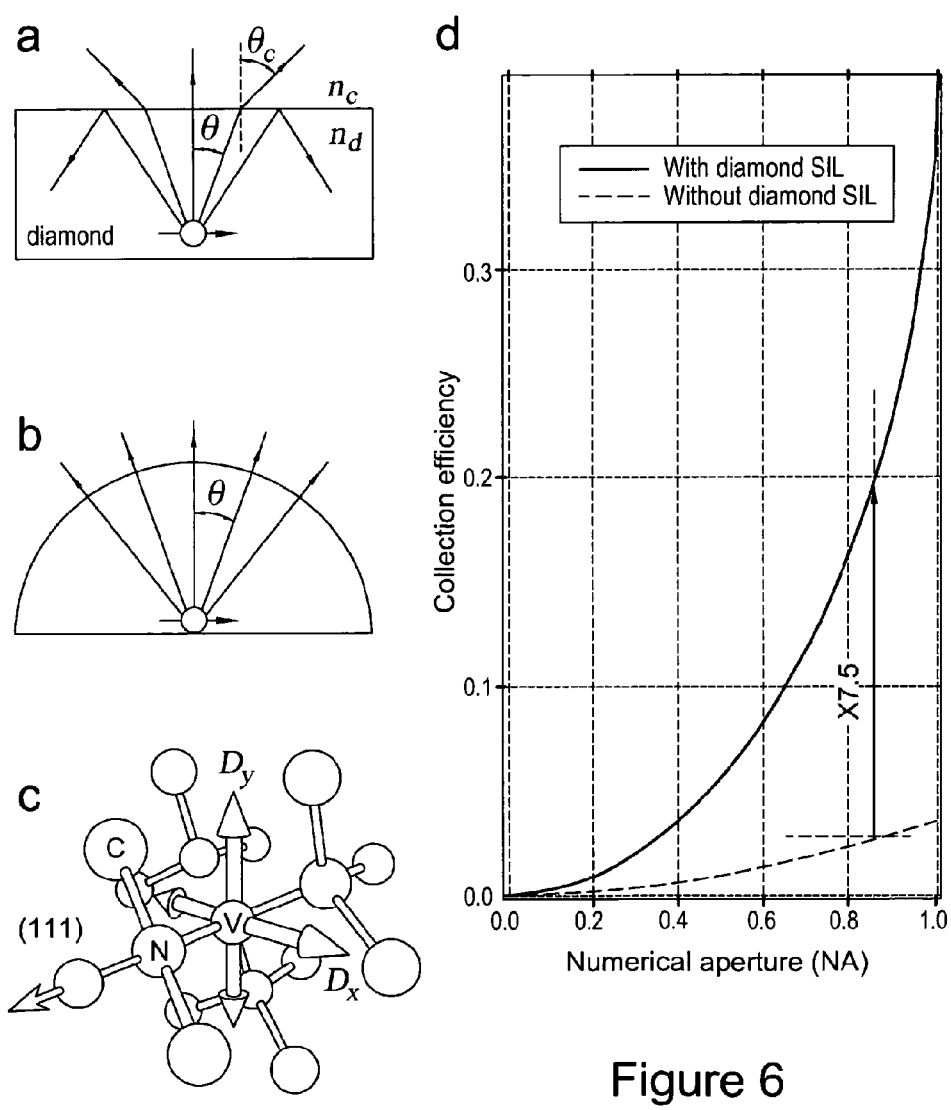
FIG. 6a illustrates photon emission without a diamond SIL.
FIG. 6b illustrates photon emission with a diamond SIL.
FIG. 6c illustrates the atomic structure of an $NV^-$ defect.
FIG. 6d shows calculated collection efficiencies from a single photon emitter in diamond, with and without a diamond SIL used as the primary collection optic.

A dipole beneath a planar diamond surface is illustrated in FIG. 6a. At the diamond interface, Snell's law imposes $n_d \sin\theta = n_c \sin\theta_c$, where $n_d$ is the refractive index of the diamond matrix and $\theta_c$ the propagation angle in the collection optics medium, characterized by a refractive index $n_c$. As a result, most of the photoluminescence is trapped inside the diamond matrix, since total internal reflection is achieved as soon as $\theta \geq \theta_{TIR} = \arcsin(n_c/n_d)$. For a diamond-air interface ($n_c = 1$ and $n_d = 2.4$), $\theta_{TIR} \approx 24.6°$.

The collection efficiencies $\eta_s$ and $\eta_p$ are obtained by integrating over the solid angle defined by the numerical aperture NA of the collection optics, leading to $$\eta_s = \int_0^{\theta_m} \int_0^{2\pi} I_s T_s \sin(\theta) d\phi d\theta \tag{3}$$

$$\eta_p = \int_0^{\theta_m} \int_0^{2\pi} I_p T_p \sin(\theta) d\phi d\theta, \tag{4}$$

where $\theta_m = \arcsin(NA/\eta_d)$, while $T_s$ and $T_p$ are respectively the transmission coefficients of the s and p polarization components through the interface. Such coefficients are given by the Fresnel equations $$T_s = 1 - \left[ \frac{n_d\cos\theta - n_c\sqrt{1-\left(\frac{n_d}{n_c}\sin\theta\right)^2}}{n_d\cos\theta + n_c\sqrt{1-\left(\frac{n_d}{n_c}\sin\theta\right)^2}} \right]^2 \qquad (5)$$

$$T_p = 1 - \left[ \frac{n_d\sqrt{1-\left(\frac{n_d}{n_c}\sin\theta\right)^2} - n_c\cos\theta}{n_d\sqrt{1-\left(\frac{n_d}{n_c}\sin\theta\right)^2} + n_c\cos\theta} \right]^2. \qquad (6)$$

A dipole located at the centre of a hemispherical diamond SIL used as a primary collection optic is illustrated in FIG. 6b. In that case, every light ray exits the SIL in a direction normal to the surface, thus avoiding any refraction effect at the interface. As a result, the collection efficiencies $\eta_s$ and $\eta_p$ are defined by equations (3) and (4), while using $\theta_m = \arcsin(NA)$ and $$T_s = T_p = \frac{4n_c n_d}{(n_c + n_d)^2}.$$

The computed collection efficiencies depend on the dipole orientation inside the diamond matrix. For NV⁻ defects, the photoluminescence is associated with two orthogonal dipoles $D_x$ and $D_y$ located in a plane perpendicular to the NV⁻ defect symmetry axis, which is a {111} crystalline axis as shown in FIG. 6c. In addition, the absolute orientation of the two transition dipoles is determined by the direction of non-axial local strain in the diamond matrix. Since local strain is randomly distributed over a diamond sample, the orientation of the two orthogonal dipoles is random in a plane perpendicular to the NV⁻ defect symmetry axis.

In the following, a [100]-oriented diamond sample is considered. For such a crystal orientation, the absolute angle between the NV⁻ defect axis and the flat diamond surface is the same for the four possible NV⁻ defect orientations. Using equations (3) and (4), the collection efficiencies have been evaluated while considering the projection of the two orthogonal dipoles on the flat diamond surface. An average over the two dipoles and over all possible strain-induced orientations was taken. The results of the calculation are shown in FIG. 6d. Using a 0.85-NA microscope objective, the collection efficiency is 2.6% for a planar diamond surface and reaches 19.6% while considering a single NV⁻ defect located at the centre of a hemispherical diamond SIL. From these simple geometrical considerations, a 7.5-fold enhancement in collection efficiency is expected for that particular NA of the collection optics.

EXPERIMENTAL

Figure 7:
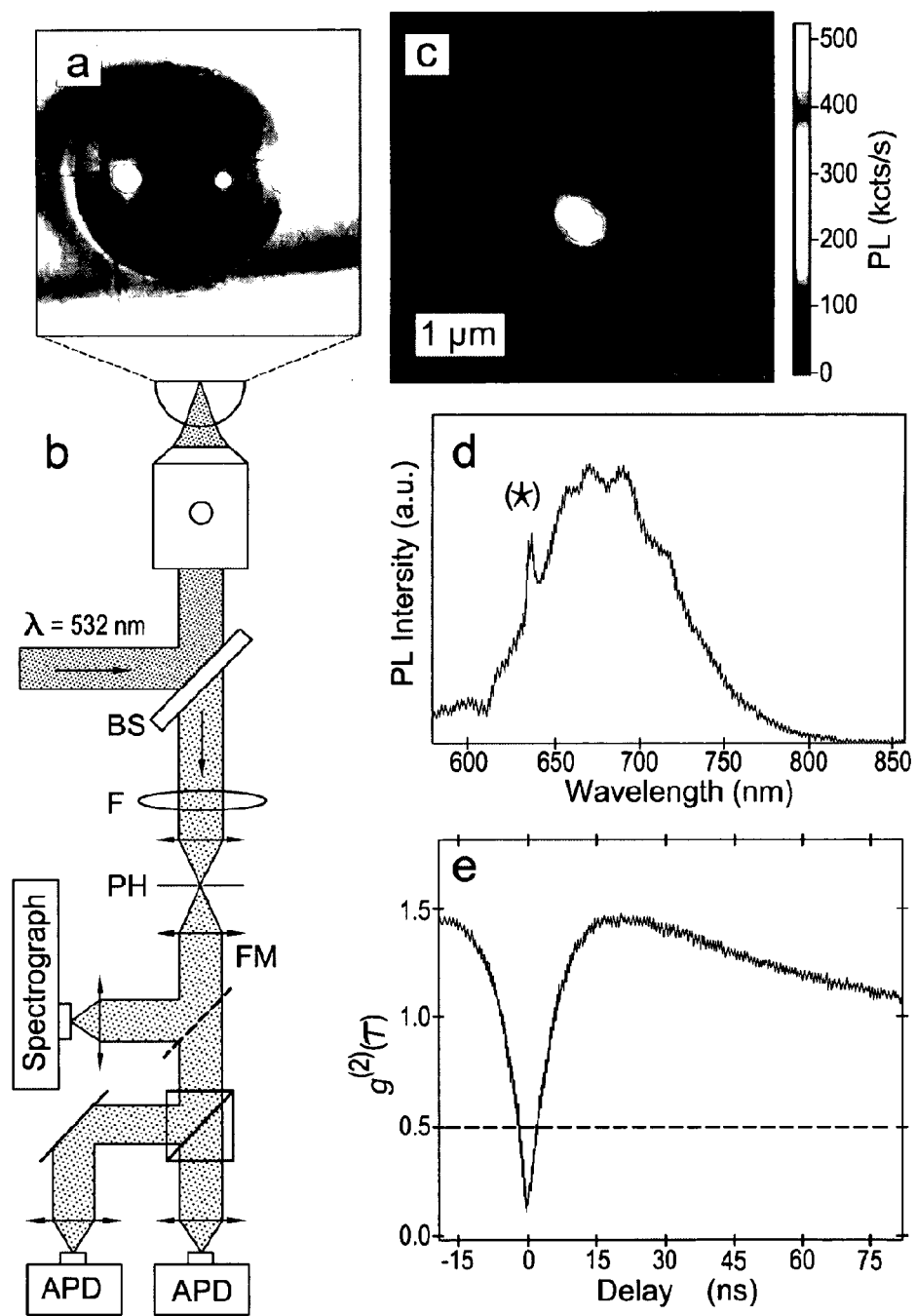
FIG. 7a shows a diamond SIL.
FIG. 7b illustrates an experiment setup for imaging $NV^-$ defects in a diamond SIL using confocal microscopy.
FIG. 7c shows a typical raster scan of a region around an $NV^-$ defect. The bright spot indicates a single $NV^-$ defect.
FIG. 7d illustrates a photoluminescence spectrum showing a broad emission with a zero phonon line at the wavelength λ=637 nm.
FIG. 7e illustrates the second-order autocorrelation function $g_{(2)(\tau)}$.

A diamond SIL as illustrated in FIG. 7a was fabricated by polishing an ultrapure synthetic type IIa diamond crystal prepared using a microwave assisted chemical vapor deposition process according to the present invention.

Native single NV⁻ defects in the diamond SIL were imaged using conventional confocal microscopy, as depicted in FIG. 7b. The experimental setup illustrated in FIG. 7b comprises the following components: a quartz plate with 5% reflectance (BS); a microscope objective with a 0.85 numerical aperture (O); a 50 μm diameter pinhole (PH); a 580 nm long-pass filter (F); and a flip mirror (FM) directing the collected photoluminescence either to an imaging spectrometer (Acton research) equipped with a back-illuminated cooled CCD matrix, or to a Hanbury-Brown and Twiss interferometer consisting of two silicon avalanche photodiodes (APD) placed on the output ports of a 50/50 beamsplitter.

A laser operating at the wavelength λ=532 nm was tightly focused onto the flat surface of the diamond SIL through a 0.85-NA microscope objective. The photoluminescence was collected by the same objective using the SIL as a primary collection optic, and spectrally filtered from the remaining pump light using a 580 nm long-pass filter. The collected light was then focused onto a 50 μm diameter pinhole and directed either to a spectrometer or to a Hanbury-Brown and Twiss (HBT) interferometer used for photon correlation measurements.

A photoluminescence raster scan of a region close to the centre of the diamond SIL is depicted in FIG. 7c, showing an isolated and bright photoluminescent spot. The Figure illustrates a typical raster scan of a region close to the centre of the diamond SIL for a laser power of 200 μW. Photoluminescence intensity is encoded in the side scale and the bright spot indicates a single NV⁻ defect, imaged with a signal to background ratio on the order of 100:1.

The photoluminescence spectrum recorded at this point exhibits a broadband emission with a characteristic zero-phonon line at the wavelength $\lambda_{ZPL}$=637 nm which is the spectral signature of a negatively-charged NV⁻ defect in diamond. Optical aberrations can be clearly observed in the confocal raster scan, since the shape of the bright spot is not perfectly circular. Such aberrations are attributed to a gap of approximately 10 μm between the NV⁻ defect location and the centre of the diamond SIL. Accordingly, it is advantageous that at least one single photon emitter is located at a lateral distance of equal to or less than 30 μm, 20 μm, 10 μm, or 5 μm from a central rotational axis of a diamond lens such as the diamond SIL. Most preferably, the single photon emitter is positioned on, or approximately on, the central rotational axis of the diamond SIL.

One possible way to achieve accurate alignment of the position of a single photon emitter with an out-coupling structure is to carefully position the single photon emitter by, for example, using an accurate implantation method. Alternatively, a single photon emitter may be identified/located with the diamond material and then the outcoupling structure formed to be accurately aligned with the single photon emitter. For example, a single photon emitter may be formed in the diamond material during a CVD growth process. The position of the single photon emitter may then be located after growth and the out-coupling structure, such as a lens (e.g. a diamond SIL), may be formed so as to be aligned with the single photon emitter.

The statistic of the emitted photons was investigated by recording a histogram of time delays between two consecutive single-photon detections using a standard HBT interferometer. After normalization to a Poissonnian statistic, the recorded histogram is equivalent to a measurement of the second-order autocorrelation function g(2)(τ) defined by $$g^{(2)}(\tau) = \frac{\langle I(t)I(t+\tau)\rangle}{\langle I(t)\rangle^2}, \qquad (7)$$

where I(t) is the PL intensity at time t. As shown in FIG. 7e, a pronounced anticorrelation effect g(2)(0)≈0.1 is evidenced at zero delay, which is the signature that a single NV⁻ defect is addressed.

With the aim of quantifying the enhancement in collection efficiency while using a diamond SIL as primary collection optics, the photoluminescence rate R was measured as a function of the laser power P. Experimental data were then fitted using a simple two-level model with the relation $$R = R_\infty \frac{P}{P + P_{sat}}, \quad (8)$$

where $P_{sat}$ is the saturation laser power and $R_\infty$ the emission rate at saturation. For the studied single NV⁻ defect imaged through the diamond SIL, the saturation parameters are $R_\infty^{SIL}$=493±5 kcounts·s−1 and $P_{sat}^{SIL}$=61±1 μW. The same experiment was then performed for a single NV⁻ defect imaged from the backside of the SIL, i.e. imaged through a planar diamond surface. In that configuration, the saturation parameters are $R_\infty^{noSIL}$=80±2 kcounts·s−1 and $P_{sat}^{noSIL}$=1330±30 μW.

Figure 8:
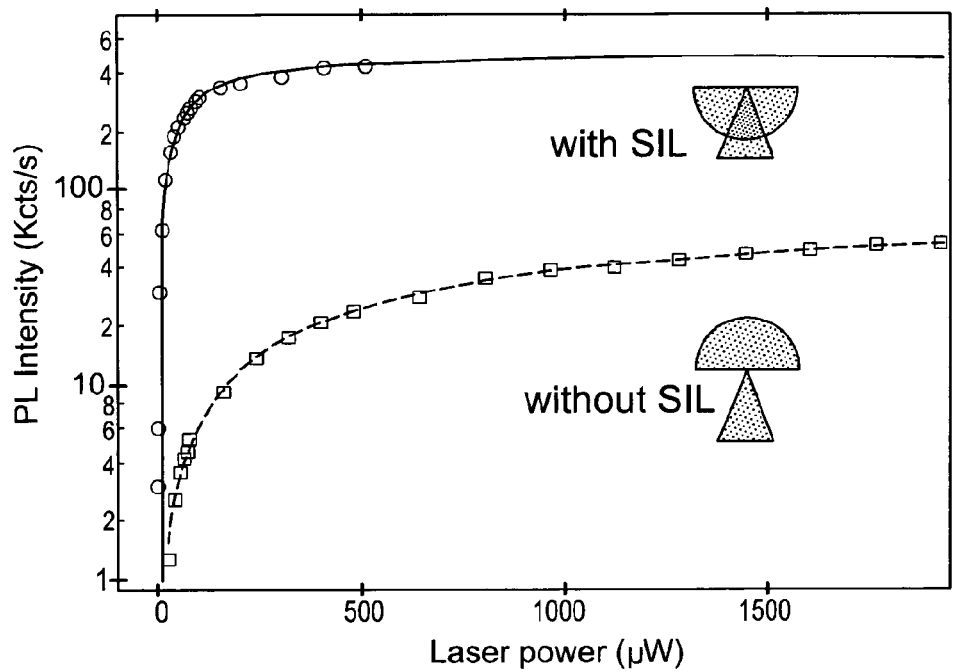
FIG. 8 illustrates background-corrected photoluminescence (PL) intensity as a function of laser power for a single $NV^-$ defect imaged through a diamond SIL and through a planar diamond surface.

FIG. 8 shows background-corrected photoluminescence (PL) intensity as a function of the laser power. The Figure illustrates results for a single NV⁻ defect imaged through the diamond SIL and through a planar diamond surface. The lines are data fitted using equation (8). The signal to background ratio is of the order of 100 for an excitation power of 60 μW.

A 6-fold enhancement is therefore achieved while using the diamond SIL as primary collection optic. Such a value is slightly smaller than the one predicted by simple geometrical optic arguments (see FIG. 6*d*). This discrepancy is attributed to optical aberrations arising from imperfect positioning of the NV⁻ defect in the centre of the diamond SIL. We note that similar collection efficiency enhancements were obtained for two others single NV⁻ defects located around 10 μm away from the centre of the SIL. If this distance exceeds 30 μm, the enhancement vanishes. A precise positioning of NV⁻ defects at the centre of the SIL can be achieved by using ion implantation techniques. In addition, collection efficiency can be further improved by using an anti-reflection coating on the hemispheric surface and a properly designed Bragg mirror deposited on the flat surface of the SIL, in order to collect backwards emitted photons.

Beyond collection efficiency enhancement, it has been noted that exciting through the diamond SIL yields to a better focusing of the excitation laser, thus leading to a smaller excitation volume. Indeed, the saturation laser power $P_{sat}$ is decreased by roughly one order of magnitude while exciting a single NV⁻ defect through the diamond SIL. This effect has interesting applications in the context of stimulated emission depletion (STED) microscopy, since the resolving power of STED is proportional to $$\sqrt{P_{sat}/P} \quad [16].$$

Figure 9:
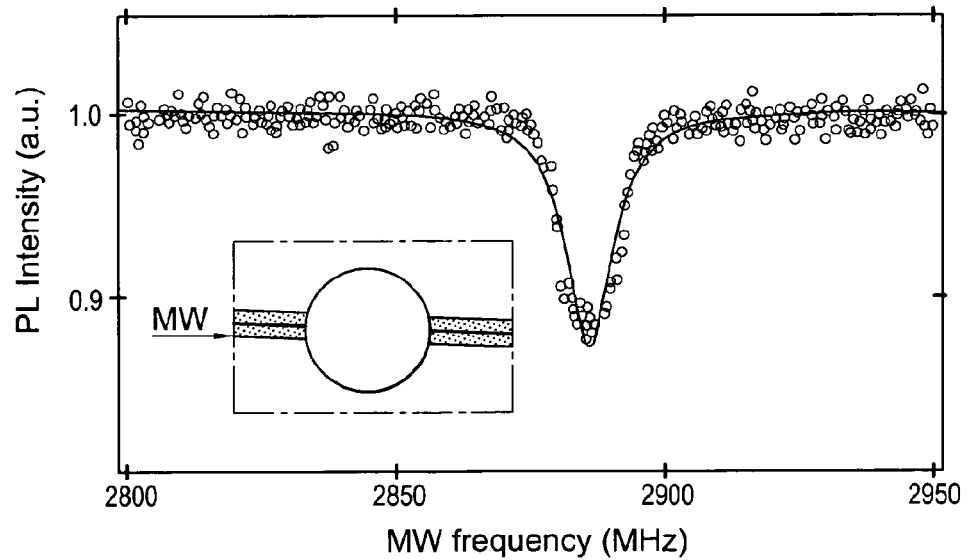
FIG. 9 illustrates electron spin resonance of a single NV⁻ defect.

Lastly, it is shown that the geometry of a diamond SIL used as primary collection optic does not give any restriction for spin manipulation of a single NV⁻ defect. Electron spin resonance of a single NV⁻ defect was pursued while fixing the diamond SIL on a microwave strip line as shown in FIG. 9. For a negatively charged NV⁻ defect, the ground state is a spin triplet state ³A, with a zero-field splitting $D_{gs}$=2.87 GHz between spin sublevels $m_s$=0 and $m_s$=±1. The photoluminescence intensity is higher when the $m_s$=0 state is populated, allowing optical detection of spin-rotation of a single NV⁻ centre by optically detected magnetic resonance (ODMR). ODMR was recorded by applying microwaves through a strip line while monitoring the photoluminescence intensity. When the microwave frequency is resonant with the transition between $m_s$=0 and $m_s$=±1 ground state sublevels, spin rotation is evidenced as a dip of the photoluminescence signal as shown in FIG. 9.

While this invention has been particularly shown and described with reference to preferred embodiments, it will be understood to those skilled in the art that various changes in form and detail may be made without departing from the scope of the invention as defined by the appendant claims.

The invention claimed is:

1. An optical element comprising:
   a first portion of single crystal CVD diamond material having first single substitutional nitrogen concentration;
   a second portion of single crystal CVD diamond material coupled to the first portion, the second portion having a second single substitutional nitrogen concentration which is lower than the first single substitutional nitrogen concentration; and
   an out-coupling structure formed at a surface of the optical element for increasing out-coupling of light, wherein the out-coupling structure comprises one or more of: a convex surface; a microlens array; an solid immersion lens (SIL); a plurality of surface indentations or nano-structures; a diffraction grating; a fresnel lens; and a coating;
   wherein the first portion is formed of a single crystal CVD diamond material having both of: a single substitutional nitrogen concentration equal to or greater than 30 ppb; and an NV⁻ concentration equal to or greater than 0.3 ppb,
   wherein the first portion of single crystal CVD diamond material has both of: a single substitutional nitrogen concentration equal to or less than 5 ppm; and an NV⁻ concentration equal to or equal to or less than 50 ppb, and
   wherein the second portion of single crystal CVD diamond material is formed of a single crystal CVD diamond material having both of: a single substitutional nitrogen concentration equal to or less than 20 ppb; and an NV⁻ concentration equal to or less than 0.15 ppb; and
   further comprising one or more single photon emitters having a decoherence time T2 equal to or greater than 0.05 ms.

2. The optical element according to claim 1, wherein the out-coupling structure is formed in a diamond surface of the optical element whereby the out-coupling structure is integrally formed by the diamond surface of the optical element.

3. The optical element according to claim 1, wherein at least a portion of the out-coupling structure is integrally formed in the first portion of single crystal CVD diamond material.

4. The optical element according to claim 1, wherein the surface of the optical element at which the out-coupling structure is formed by one of the following crystallographic planes: {100}; {110}; {111}; {113}, or within 10° from one of the aforementioned crystallographic planes.

5. The optical element according to claim 1, wherein the second portion comprises a layer having a thickness equal to or greater than 0.1 μm.

6. The optical element according to claim 1, wherein the first portion has a single substitutional nitrogen concentration greater than the second portion by a factor of at least 5.

7. The optical element according to claim 1, wherein the first portion has a total concentration of ¹³C greater than 0.9%.

8. The optical element according to claim 1, wherein the optical element is formed of a single crystal diamond including both the first and second portions whereby the first and second portions are coupled together by being incorporated into the single crystal diamond.

9. The optical element according to claim 1, wherein the one or more single photon emitters are disposed in the second portion of single crystal CVD diamond material.

10. The optical element according to claim 1, wherein a surface of the optical element opposite to the surface of the optical element at which the out-coupling structure is formed is formed by one of the following crystallographic planes: {100}; {110}; {111}; {113}, or within 10° from one of the aforementioned crystallographic planes.

11. The optical element according to claim 4, wherein the surface of the optical element at which the out-coupling structure is formed by a {111} crystallographic plane to within 10°.

12. The optical element according to claim 7, wherein the first portion has a natural isotopic abundance of $^{13}C$ relative to $^{12}C$.

13. The optical element according to claim 10, wherein the surface of the optical element opposite to the surface of the optical element at which the out-coupling structure is formed is formed by a {111} crystallographic plane to within 10°.

14. The optical element according to claim 13, wherein the out-coupling structure comprises an antireflective coating.

15. An optical element comprising:
a first portion of single crystal CVD diamond material having first single substitutional nitrogen concentration;
a second portion of single crystal CVD diamond material coupled to the first portion, the second portion having a second single substitutional nitrogen concentration which is lower than the first single substitutional nitrogen concentration; and
an out-coupling structure formed at a surface of the optical element for increasing out-coupling of light,
wherein the first portion is formed of a single crystal CVD diamond material having both of: a single substitutional nitrogen concentration equal to or greater than 30 ppb; and an $NV^-$ concentration equal to or greater than 0.3 ppb,
wherein the first portion of single crystal CVD diamond material has both of: a single substitutional nitrogen concentration equal to or less than 5 ppm; and an $NV^-$ concentration equal to or equal to or less than 50 ppb,
wherein the second portion of single crystal CVD diamond material is formed of a single crystal CVD diamond material having one or more of: a single substitutional nitrogen concentration equal to or less than 20 ppb; and an $NV^-$ concentration equal to or less than 0.15 ppb; and
wherein the out-coupling structure is a convex surface which is formed by the first and second portions of single crystal CVD diamond material, the first portion forming a spherical cap and the second portion forming a spherical segment.

16. The optical element according to claim 15, wherein the optical structure forms a solid immersion lens (SIL).

17. An optical element comprising:
a first portion of single crystal CVD diamond material having first single substitutional nitrogen concentration;
a second portion of single crystal CVD diamond material coupled to the first portion, the second portion having a second single substitutional nitrogen concentration which is lower than the first single substitutional nitrogen concentration; and
an out-coupling structure formed at a surface of the optical element for increasing out-coupling of light, wherein the out-coupling structure comprises one or more of: a convex surface; a microlens array; a solid immersion lens (SIL); a plurality of surface indentations or nano-structures; a diffraction grating; a fresnel lens; and a coating;
wherein the first portion is formed of a single crystal CVD diamond material having both of: a single substitutional nitrogen concentration equal to or greater than 30 ppb; and an $NV^-$ concentration equal to or greater than 0.3 ppb,
wherein the first portion of single crystal CVD diamond material has both of: a single substitutional nitrogen concentration equal to or less than 5 ppm; and an $NV^-$ concentration equal to or equal to or less than 50 ppb,
wherein the second portion of single crystal CVD diamond material is formed of a single crystal CVD diamond material having one or more of: a single substitutional nitrogen concentration equal to or less than 20 ppb; and an $NV^-$ concentration equal to or less than 0.15 ppb; and
further comprising a third portion of single crystal CVD diamond material coupled to the second portion on an opposite side to the first portion.

18. The optical element according to claim 17, wherein one or more single photon emitters are disposed in the third portion.

* * * * *